United States Patent
Scheiper et al.

(10) Patent No.: US 8,609,509 B2
(45) Date of Patent: Dec. 17, 2013

(54) SUPERIOR INTEGRITY OF HIGH-K METAL GATE STACKS BY FORMING STI REGIONS AFTER GATE METALS

(75) Inventors: Thilo Scheiper, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 69 days.

(21) Appl. No.: 13/239,943

(22) Filed: Sep. 22, 2011

(65) Prior Publication Data

US 2013/0075820 A1    Mar. 28, 2013

(51) Int. Cl.
*H01L 21/76* (2006.01)
*H01L 21/70* (2006.01)

(52) U.S. Cl.
USPC .... 438/424; 257/508; 257/510; 257/E21.703; 438/322; 438/353

(58) Field of Classification Search
None
See application file for complete search history.

(56) References Cited

U.S. PATENT DOCUMENTS

| | | | |
|---|---|---|---|
| 6,583,000 B1 | 6/2003 | Hsu et al. | 438/222 |
| 2008/0036013 A1* | 2/2008 | Kotani | 257/374 |
| 2009/0057776 A1* | 3/2009 | Mehrad et al. | 257/372 |
| 2009/0057813 A1* | 3/2009 | Wei et al. | 257/510 |
| 2010/0109056 A1* | 5/2010 | Pal et al. | 257/288 |
| 2010/0164014 A1 | 7/2010 | Kronholz et al. | 257/392 |
| 2010/0289090 A1* | 11/2010 | Kronholz et al. | 257/392 |

FOREIGN PATENT DOCUMENTS

| | | | |
|---|---|---|---|
| DE | 102007041206 A1 | 3/2009 | H01L 21/762 |
| DE | 102008063402 A1 | 7/2010 | H01L 21/8234 |
| DE | 102009021484 A1 | 11/2010 | H01L 21/8234 |

OTHER PUBLICATIONS

Translation of Official Communication from German Patent Office for German Patent Application No. 10 2011 090 170.1 dated May 10, 2012.

* cited by examiner

*Primary Examiner* — Julio J Maldonado
*Assistant Examiner* — Joseph Galvin, III
(74) *Attorney, Agent, or Firm* — Williams, Morgan & Amerson, P.C.

(57) ABSTRACT

When forming sophisticated high-k metal gate electrode structures in an early manufacturing stage, superior process robustness, reduced yield loss and an enhanced degree of flexibility in designing the overall process flow may be accomplished by forming and patterning the sensitive gate materials prior to forming isolation regions.

23 Claims, 11 Drawing Sheets

SUPERIOR INTEGRITY OF HIGH-K METAL GATE STACKS BY FORMING STI REGIONS AFTER GATE METALS

BACKGROUND OF THE INVENTION

1. Field of the Invention

Generally, the present disclosure relates to the fabrication of highly sophisticated integrated circuits including advanced transistor elements that comprise gate structures including a high-k gate dielectric material and a metal-containing electrode material provided in an early manufacturing stage.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of integrated circuits, field effect transistors represent one important type of circuit element that substantially determines performance of the integrated circuits. Generally, a plurality of process technologies are currently practiced for forming field effect transistors, wherein, for many types of complex circuitry, CMOS technology is one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the mobility of the charge carriers in the channel region.

The continuous shrinkage of critical dimensions of transistor elements has resulted in a gate length of field effect transistors of 50 nm and significantly less, thereby providing sophisticated semiconductor devices having enhanced performance and an increased packing density. The increase of electrical performance of the transistors is strongly correlated with a reduction of the channel length, which may result in an increased drive current and switching speed of the field effect transistors. On the other hand, the reduction of the channel length is associated with a plurality of issues in terms of channel controllability and static leakage currents of these transistors. It is well known that field effect transistors with a very short channel may require an increased capacitive coupling between the gate electrode structure and the channel region in order to provide the desired static and dynamic current flow controllability. Typically, the capacitive coupling is increased by reducing the thickness of the gate dielectric material, which is typically formed on the basis of a silicon dioxide base material, possibly in combination with a nitrogen species, due to the superior characteristics of a silicon/silicon dioxide interface. Upon implementing a channel length of the above-identified order of magnitude, however, the thickness of the silicon dioxide-based gate dielectric material may reach values of 1.5 nm and less, which in turn may result in significant leakage currents due to a direct tunneling of the charge carriers through the very thin gate dielectric material. Since the exponential increase of the leakage currents upon further reducing the thickness of silicon dioxide-based gate dielectric materials is not compatible with the thermal power design requirements, other mechanisms have been developed so as to further enhance transistor performance and/or reduce the overall transistor dimensions.

For example, by creating a certain strain component in the channel region of silicon-based transistor elements, the charge carrier mobility and, thus, the overall conductivity of the channel may be enhanced. For a silicon material with a standard crystallographic configuration, i.e., a (100) surface orientation with the channel length direction oriented along a <110> equivalent direction, tensile strain in the current flow direction may enhance conductivity of electrons, thereby improving transistor performance of N-channel transistors. On the other hand, generating a compressive strain in the current flow direction may increase the mobility of holes and may, thus, provide superior conductivity in P-channel transistors. Consequently, a plurality of strain-inducing mechanisms have been developed in the past, wherein internal strain-inducing sources, such as an embedded strain-inducing semiconductor material, have proven to be very efficient strain-inducing mechanisms. For example, frequently, the incorporation of a compressive strain-inducing silicon/germanium alloy in the drain and source areas of P-channel transistors is applied in order to enhance performance of these transistors. For this purpose, in an early manufacturing stage, cavities are formed in the active region laterally adjacent to the gate electrode structure of the P-channel transistor, while the N-channel transistors are covered by a spacer layer and a resist mask. These cavities may be subsequently refilled with the silicon/germanium alloy on the basis of selective epitaxial growth techniques. During the etch process for forming the cavities and during the subsequent epitaxial growth process, the gate electrode of the P-channel transistor has to be encapsulated in order to not unduly expose sensitive materials of the gate electrode structure, such as a silicon-based electrode material, to the process ambient for forming the cavities and for selectively growing the silicon/germanium alloy. Thereafter, the gate electrode structures may be exposed and the further processing may be continued by forming drain and source regions in accordance with any appropriate process strategy.

Basically, the above-described strain-inducing mechanism is a very efficient concept for improving transistor performance of P-channel transistors, wherein the efficiency of the finally obtained strain in the channel region of the transistor, however, strongly depends on the internal strain level of the semiconductor alloy and on the lateral offset of this material from the channel region. Typically, the material composition of the strain-inducing semiconductor alloy is restricted by currently available sophisticated selective epitaxial deposition recipes, which, in the case of a silicon/germanium alloy, may presently not allow germanium concentrations of significantly more than approximately 30 atomic percent. Consequently, a further improvement of the total strain in the channel region requires a reduction of the lateral offset of the silicon/germanium alloy from the channel region so that any protective spacer structures may have to be provided with a reduced width.

In addition to providing strain-inducing mechanisms in field effect transistors, also sophisticated gate electrode materials have been proposed in order to overcome the restrictions of conventional silicon dioxide/polysilicon-based gate electrode structures. To this end, the conventional silicon dioxide-based gate dielectric material is replaced, at least partially, by a so-called high-k dielectric material, i.e., a dielectric material having a dielectric constant of 10.0 and higher, which may result in a desired high capacitance between the gate electrode and the channel region, while nevertheless a certain minimum physical thickness is provided so as to keep the resulting leakage currents at an acceptable level. For this purpose, a plurality of dielectric materials, such as hafnium oxide-based materials, zirconium oxide, aluminum oxide and the like, are available and may be used in sophisticated gate electrode structures. Furthermore, the polysilicon material may also be replaced, at least in the vicinity of the gate dielectric material, since typically polysilicon suffers from charge carrier depletion in the vicinity of the gate dielectric material, which may reduce the effective capacitance. Moreover, with sophisticated high-k gate dielectric materials, the work function of standard polysilicon materials obtained by a corresponding doping may no longer be sufficient to provide the required electronic characteristics of the gate electrode material in order to obtain a desired threshold voltage of the transistors under consideration. For this reason, specific work function adjusting metal species, such as aluminum, lanthanum and the like, are typically incorporated in the gate dielectric material and/or in an appropriate electrode material in order to obtain a desired work function and also increase conductivity of the gate electrode material at least in the vicinity of the gate dielectric material.

Thus, a plurality of sophisticated process strategies have been developed, wherein, in some promising approaches, the sophisticated gate materials, such as a high-k dielectric material and a metal-containing electrode material, possibly including a work function adjusting metal species, may be provided in an early manufacturing stage in combination with a polysilicon material, thereby providing a high degree of compatibility with conventional process strategies for forming sophisticated field effect transistors. It turns out, however, that a reliable confinement of the sensitive material system, including the high-k dielectric material and the metal-containing electrode material, has to be guaranteed in order to avoid a shift in threshold voltage or any other variabilities of the sophisticated high-k metal gate electrode structures.

In an attempt to further enhance device performance of sophisticated field effect transistors, it has been proposed to combine sophisticated high-k metal gate electrode structures with a strain-inducing mechanism, for instance, by incorporating a strain-inducing semiconductor alloy in the active regions of the transistors. In this case, the encapsulation of the gate electrode structure of the transistor may have to be implemented on the basis of detrimental requirements. On the one hand, the confinement of the gate electrode structure has to ensure integrity of the sensitive material system, for example, prior to, during and after the incorporation of the strain-inducing semiconductor material, and, on the other hand, a reduced thickness of any protective spacer elements, such as silicon nitride-based materials, is to be implemented in view of enhancing efficiency of the strain-inducing mechanism. Consequently, a compromise of the thickness of the spacer elements and gain in performance of sophisticated transistors is typically applied.

Upon further scaling the transistors elements, increasing yield loss has been observed when forming high-k metal gate electrode structures in an early manufacturing stage, which is believed to be caused by insufficient encapsulation, in particular of the sensitive gate metal materials, even if the liner width is applied that is still compatible with the overall design rules. Without restricting the present application to the following explanation, it is assumed that, in particular, the pronounced topography of isolation regions in the vicinity of active regions has a significant influence on gate failure mechanisms, as will be described in more detail with reference to FIGS. 1a-1d.

FIG. 1a schematically illustrates a top view of a semiconductor device 100 or the layout thereof corresponding to a manufacturing stage in which gate electrode structures are formed so as to extend above active regions and isolation regions of the device 100. In the example shown, active regions 102a, 102b, 102c, 102d are provided as required by a specific layout, wherein, for instance, the active regions 102a, 102b may correspond to P-channel transistors and N-channel transistors, respectively. Similarly, the active regions 102c, 102d may correspond to a P-channel transistor and an N-channel transistor, respectively. Furthermore, as shown, gate electrode structures 160a, 160b may represent common gate electrode structures for transistors to be formed in and above the active regions 102a, 102b, while corresponding gate electrode structures 160c, 160d may be formed above the associated active regions and may extend above the isolation region 102i, as required by the overall circuit layout. Furthermore, in sophisticated semiconductor devices, frequently, a plurality of dummy gates may be required, for instance with respect to enhancing overall process conditions when patterning the gate electrode structures 160a, 160b, 160c, 160d, while, in other cases, restrictive layout requirements may necessitate the provision of gate electrode lines to be placed in close proximity to one or more active regions, for instance as shown in the case of a gate electrode structure 160i, which extends along the active regions 102a, 102b.

The active regions 102a, 102b, 102c, 102d are typically formed on the basis of well-established process strategies including the formation of appropriate trenches in a semiconductor layer so as to finally form the isolation region 102i, which thus laterally delineates the various active regions 102a, 102b, 102c, 102d. In sophisticated semiconductor devices, it may frequently be observed that, in transition areas between an active region and an isolation region, a pronounced surface topography, i.e., a recessing of the isolation region, is created, which may have a significant influence on the further processing of the device, for instance when forming gate electrode structures, incorporating a strain-inducing semiconductor material into portions of the active regions and the like. For example, in particular, end portions 160e of the gate electrode structures 160a, 160b, 160c, 160d may thus be formed at or in close proximity to any such recessed areas in the isolation regions 102i. Consequently, such areas, indicated by 120e, may be prone to significant gate failures, for instance with respect to insufficient encapsulation of sensitive materials and the like. Similarly, an edge area 120l may also be identified as a critical region since also in this area a pronounced recessing or surface topography of the isolation region 102i is observed, thereby also affecting, for instance, the gate electrode structure 160i. Moreover, for the common gate electrode structures 160a, 160b, an intermediate region 120i, i.e., the portion of the gate electrode structures 160a, 160b in which the gate electrode structures "change" from a P-type electrode structure to an N-type electrode structure, may also represent a critical area with respect to gate failures.

FIG. 1b schematically illustrates a cross-sectional view of the device 100 according to the section indicated as Ib in FIG. 1a. As shown, a semiconductor layer 102, such as a silicon material and the like, is formed above a substrate 101 and comprises a plurality of active regions, for example the active region 102a, that is laterally delineated by the isolation region 102i. As discussed above, a pronounced recessing, indicated as 102r, is typically observed in the vicinity of the active region 102a. Consequently, the gate electrode structure 160i, which may require a reduced lateral offset from the active region 102a, may be formed at least partially within the recess 102r, thereby increasing the probability of causing gate failures and/or process non-uniformities during the further processing. The gate electrode structures 160a, 160i may have basically the same configuration and may comprise a gate dielectric material 161, which may include a high-k dielectric material such as hafnium oxide and the like, followed by a metal-containing electrode material 162, which also typically includes a work function metal species, such as aluminum and the like. Furthermore, typically, a semiconductor-based electrode material 163, such as silicon, is formed above the electrode material 162, followed by a dielectric cap layer or layer system 165, which is typically comprised of silicon nitride and the like. Furthermore, frequently, the electronic characteristics of at least some active regions have to be adjusted on the basis of an additional dedicated semiconductor material, as indicated by 103, which may be provided in the form of a semiconductor alloy, such as a silicon/germanium alloy, having a specified material composition and thickness. For example, a silicon/germanium material is frequently used in active regions of P-channel transistors in order to adjust a required band gap offset with respect to N-channel transistors in combination with complex high-k metal gate electrode structures. Consequently, providing the semiconductor alloy 103 as a part of the active region 102a in a selective manner may additionally contribute to a more pronounced topography between the active region 102a and the isolation region 102i. Furthermore, as discussed above, the material 161 and in particular the material 162 have to be encapsulated so as to avoid undue shift of material characteristics and thus characteristics of the resulting transistors, which is typically accomplished by providing a liner or spacer 164, for instance comprised of silicon nitride. Moreover, as explained before, a width of the spacer 164 may not be arbitrarily increased since increased spacer width may significantly influence the further processing and in particular the finally obtained transistor characteristics, for example in view of lateral dopant profiles of drain and source regions, the lateral offset of the strain-inducing semiconductor material that may be incorporated into at least some of the active regions and the like. Due to the pronounced recessing of the isolation region 102i in the vicinity of the active region 102a, however, a reduced degree of encapsulation or even dopant areas of the materials 161, 162 may occur, thereby giving rise to significant gate failures and/or process non-uniformities.

FIG. 1c schematically illustrates the device 100 according to a cross-sectional view as indicated by Ic in FIG. 1a. As shown, the gate electrode structure 160b may extend with its end portion 160e into the recess 102r, thereby also giving rise to an insufficient encapsulation of the materials 161 and 162 by the liner or spacer 164, as shown in FIG. 1c.

Consequently, due to the recessed configuration of the isolation region 102i, a certain probability of "footing" of the gate electrode structures may be induced during the process sequence for patterning the gate electrode structures, which may result in a thinned liner material covering the sidewall portions of the materials 161 and 162, or one or both of these materials may even be exposed by the spacer 164, as is, for instance, shown in FIGS. 1b and 1c.

The semiconductor device 100 as shown in FIGS. 1b and 1c is typically formed on the basis of the following process strategy. The isolation region 102i is formed in the semiconductor layer 102 on the basis of sophisticated lithography, etch, deposition, anneal, planarization and removal techniques in order to form trenches in the layer 102 and subsequently fill the trenches with an appropriate dielectric material, such as silicon dioxide and the like. Thereafter, the electronic characteristics of the active regions are adjusted, for instance, by implanting appropriate well dopant species using well-established masking regimes. Next, the process sequence is typically applied in order to selectively provide the material 103, for instance within the active regions of P-channel transistors, which typically includes the formation of a hard mask material, such as a silicon dioxide material, which is selectively removed from the active regions of P-channel transistors, such as the active region 102a. Thereafter, a selective epitaxial growth process is applied in which the deposition of the desired semiconductor alloy is restricted to exposed silicon surface areas, while a pronounced material deposition on dielectric surface areas is suppressed. Thereafter, the growth mask is removed from the active regions and the further processing is continued by forming the gate electrode structures. It is to be noted, however, that the process sequence for forming the hard mask material, the selective deposition, which may include additional cleaning processes and the like, may significantly contribute to the generation of the recesses 102r, in particular in the vicinity of the active regions of P-channel transistors. The patterning of the gate electrode structures is typically accomplished by forming the gate dielectric material 161 and appropriate electrode materials in the form of the layer 162, which, however, is typically provided with different characteristics for P-channel transistors and N-channel transistors, or generally for different types of transistors, thereby also requiring a plurality of deposition and patterning processes. Thereafter, the silicon material 163 in combination with the cap layer 165 is deposited and patterned on the basis of any appropriate patterning strategy, for instance applying a double exposure/double etch strategy for patterning the material 165, which may then be efficiently used as a hard mask for etching through the materials 163, 162 and 161 on the basis of well-established etch recipes. Next, the spacer 164 is formed by depositing, for instance, a silicon nitride layer using well-established deposition techniques and patterning the layer into the spacer elements 164, which, however, may be performed at different process stages for different types of transistors, for instance when selectively incorporating a strain-inducing semiconductor material into some of the active regions.

FIG. 1d schematically illustrates a cross-sectional view of the device 100 according to the section Id in FIG. 1a, wherein the gate electrode structure 160a thus represents a common gate electrode structure connecting the active region 102a of a P-channel transistor with the active region 102b of an N-channel transistor. In the manufacturing stage shown, the gate electrode structure 160a is already patterned in accordance with device requirements and a spacer layer 164s is provided so as to encapsulate the sensitive materials 161, 162, as discussed above. In some sophisticated approaches, as already explained before, the spacer layer 164s may be patterned differently above the active regions 102a, 102b, for example when a strain-inducing material is to be incorporated into the active region 102a. In this case, a dedicated etch mask 121b is used for covering the active region 102b and a corresponding portion of the gate electrode structure 160a while exposing the device 100 to a reactive etch atmosphere. Thereafter, the processing may be continued, for instance, by etching into the active region 102a and forming therein a strain inducing-semiconductor material and the like. In a further advanced manufacturing stage, the spacer layer 164s may also be patterned into spacer elements above the active region 102b, thereby requiring a further mask 121a in order to protect the previously formed spacer elements formed adjacent to and above the active region 102a. If, however, a certain degree of misalignment, as indicated by 121o, is induced, a portion of the spacer layer 164s may be exposed twice to the corresponding reactive etch atmosphere, thereby significantly reducing the spacer thickness above the isolation region 102i between the active regions 102b, 102a. Consequently, during the further processing, this insufficient encapsulation may result in significant material removal, in particular of the layer 162, for instance caused by highly efficient cleaning recipes using SPM/APM, which may result in gate failures and the like. Furthermore, generally, the removal of a portion of the layer 162 in areas of gate electrode structures that are formed above the isolation regions 102i may result in reduced mechanical stability, which in turn may cause material delamination and the like during the further processing.

Moreover, as is evident from FIG. 1d, the recessing of the isolation region 102i, at least in the vicinity of the active regions 102b, 102a, effectively results in a "three-dimensional" channel, in particular in the active region 102a, due to the provision of the additional semiconductor material 103 since, in addition to the surface of the active regions, also a portion of the sidewalls thereof, indicated as 102s, is in contact with the gate electrode structure 160a. Consequently, the effective channel width, i.e., in FIG. 1d the horizontal extension, is increased by these sidewall surface areas 102s, which may, in particular in short width transistors, significantly contribute to the overall transistor characteristics. For example, in sophisticated static RAM areas, P-channel transistors have a design width of approximately 80 nm so that the height of the sidewall surface areas 102s of approximately 7 nm results in an effective width of 80+7+7 nm increases the effective width by approximately 20 percent. For the active region 102b, this effect is also present, however to a lesser degree.

Consequently, the above-described complex conventional process strategy may result in gate failures, process non-uniformities and variations of the resulting transistor characteristics, thereby making this per se promising approach less attractive.

In view of the situation described above, the present disclosure provides manufacturing techniques and semiconductor devices in which high-k metal gate electrode structures, or at least the critical materials thereof, may be provided in an early manufacturing stage, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides manufacturing techniques and semiconductor devices in which superior process uniformity and transistor characteristics may be obtained by forming critical materials of high-k metal gate electrode structures prior to providing isolation regions. In this manner, critical materials, such as a high-k dielectric material, a metal-containing electrode material, possibly in combination with a work function adjusting metal species, positioned above the respective active regions only, thereby obtaining a well-defined extension of gate electrode structures to be formed from these materials. Furthermore, the surface topography in isolation regions may be significantly reduced since main contributors to the surface topography, such as the incorporation of a threshold voltage semiconductor alloy in some active regions, may no longer affect the isolation regions. In addition to the reduced surface topography, critical gate materials can no longer be exposed above isolation regions since any such material is no longer present in these isolation regions, thereby reducing the probability of creating gate failures and process non-uniformities due to a missing electrode metal.

One illustrative method disclosed herein comprises forming a gate dielectric material and a first electrode material on a semiconductor layer of a semiconductor device. The method further comprises forming an isolation region in the semiconductor layer so as to laterally delineate active regions in the semiconductor layer, wherein the isolation region extends through the gate dielectric material and the first electrode material. The method further comprises forming a second electrode material above the active region and the isolation region. Additionally, the method comprises forming gate electrode structures at least from the second electrode material, the gate dielectric material and the first electrode material.

A further illustrative method disclosed herein comprises forming a first part of a first gate layer stack above a first portion of a semiconductor layer of the semiconductor device. Moreover, the method comprises forming a first part of a second gate layer stack on a second portion of the semiconductor layer. The method further comprises forming an isolation region in the semiconductor layer so as to laterally separate the first parts of the first and second gate layer stacks. A second part of the first and second gate layer stacks is formed above the first parts and above the isolation region. The method additionally comprises forming a first gate electrode structure of a first transistor from the first and second parts of the first gate layer stack and a second gate electrode structure of a second transistor from the first and second parts of the second gate layer stack, wherein the first and second transistors differ in conductivity type.

One illustrative semiconductor device disclosed herein comprises an active region that is laterally delineated by an isolation region. Furthermore, the semiconductor device comprises a gate electrode structure formed on the active region and having an end portion positioned above the isolation region. The gate electrode structure comprises a high-k dielectric material formed on the active region, wherein the high-k dielectric material extends to the isolation region without overlapping the isolation region.

BRIEF DESCRIPTION OF THE DRAWINGS

The disclosure may be understood by reference to the following description taken in conjunction with the accompanying drawings, in which like reference numerals identify like elements, and in which.

Figure 1A:
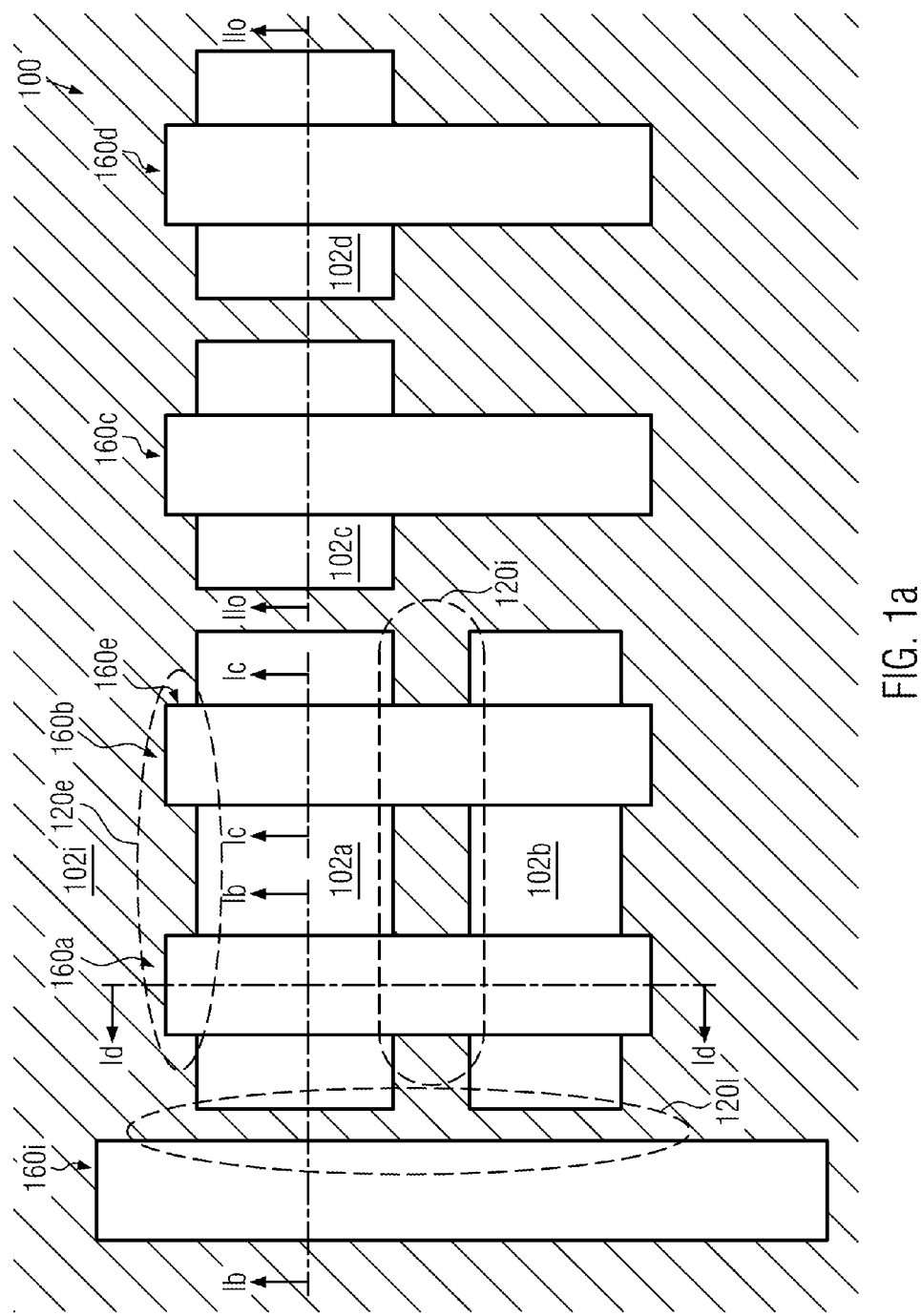
FIG. 1a schematically illustrates a top view of a semiconductor device or a layout thereof.
Figure 1B:
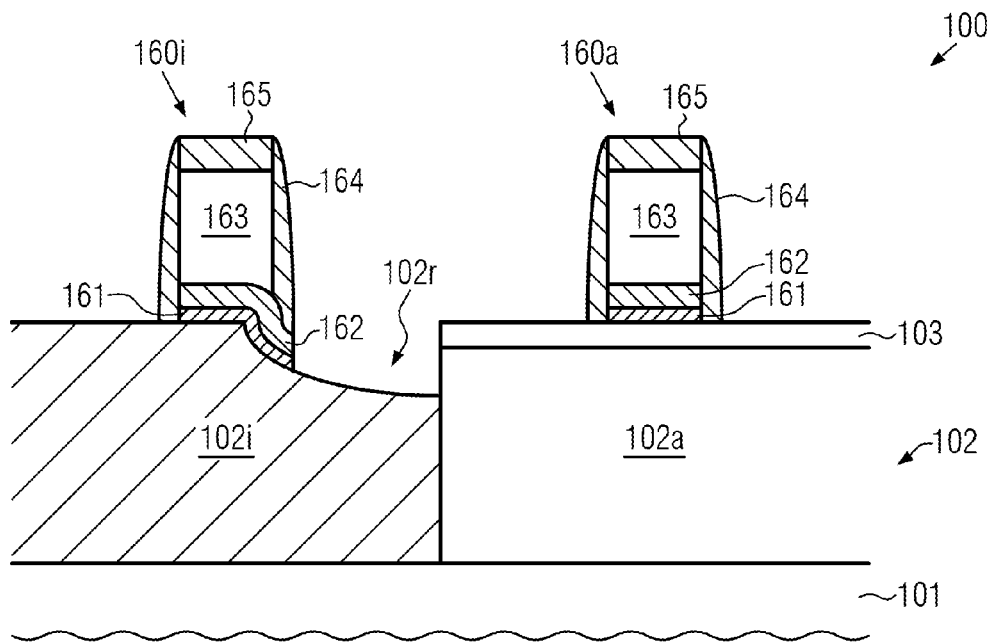
FIGS. 1b-1d schematically illustrate various cross-sectional views of the semiconductor device in a manufacturing stage in which high-k metal gate electrode structures are provided.
Figure 1C:
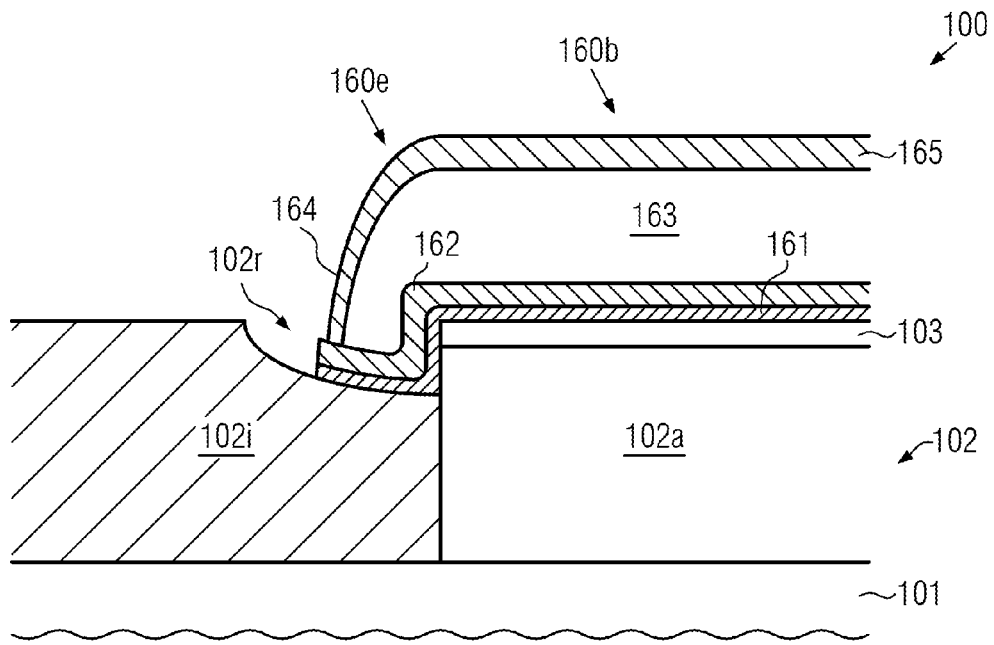
Figure 1D:
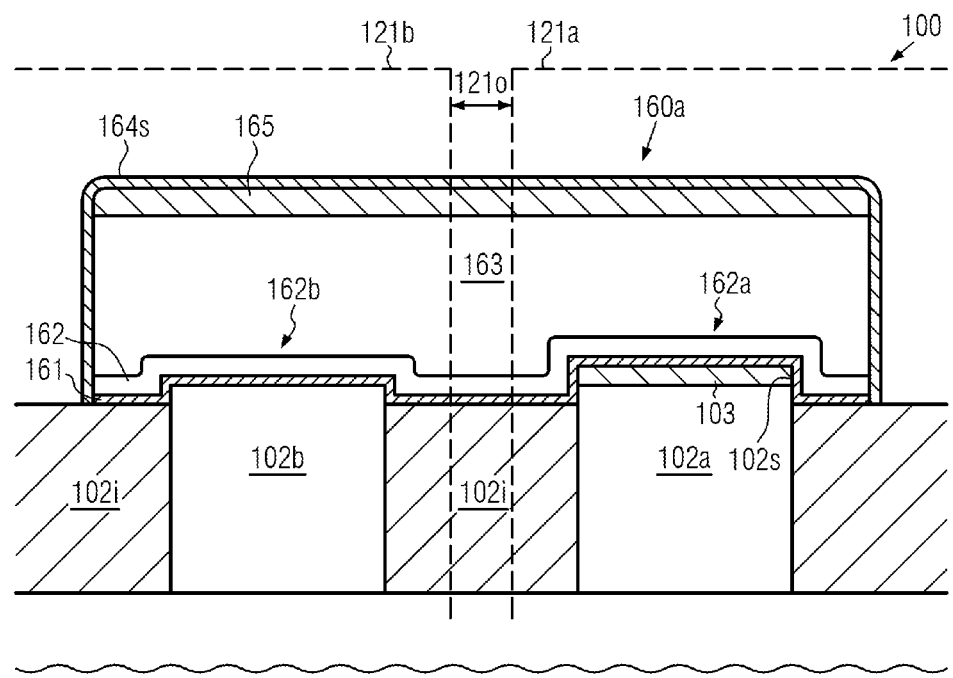

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In illustrative embodiments, the present disclosure relates to manufacturing techniques and semiconductor devices in which sophisticated gate materials for at least some gate electrode structures may be formed prior to providing isolation regions in a semiconductor material. To this end, appropriate materials may be applied for gate electrode structures, such as a gate dielectric layer including a high-k dielectric material and one or more electrode materials as required for adjusting the characteristics of at least one type of transistor, wherein the deposition and patterning of these materials may be accomplished on the basis of superior surface conditions. Similarly, if a threshold voltage adjusting semiconductor material is to be provided for at least some of the transistors, any such material may be efficiently formed on the basis of superior surface conditions due to the absence of any isolation regions. After any corresponding critical process steps for providing sensitive gate materials, possibly in combination with a threshold voltage adjusting semiconductor alloy, further gate materials may be deposited and may be patterned on the basis of any appropriate process strategy. For example, sophisticated double exposure/double etch strategies may be applied, wherein, in particular, the defining of the gate width may be accomplished on the basis of a less critical patterning regime, since the critical gate materials, such as the metal-containing electrode material, may not be present above any isolation regions. Furthermore, a high degree of flexibility in performing the two different gate patterning processes is accomplished since, for example, the patterning process for defining the gate width may be performed prior to the patterning process for defining the gate length, or this patterning process may be applied in an advanced manufacturing stage, for example after the formation of protective spacer elements, since a corresponding encapsulation of the gate electrode structure above the isolation region may no longer be required.

Figure 2A:
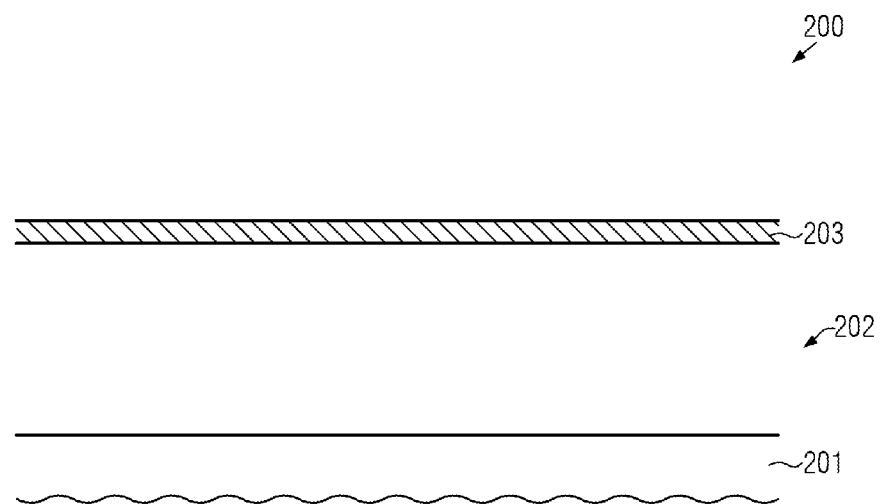
FIGS. 2a-2b schematically illustrate cross-sectional views of a semiconductor device in an early manufacturing stage, according to illustrative embodiments.
Figure 2B:
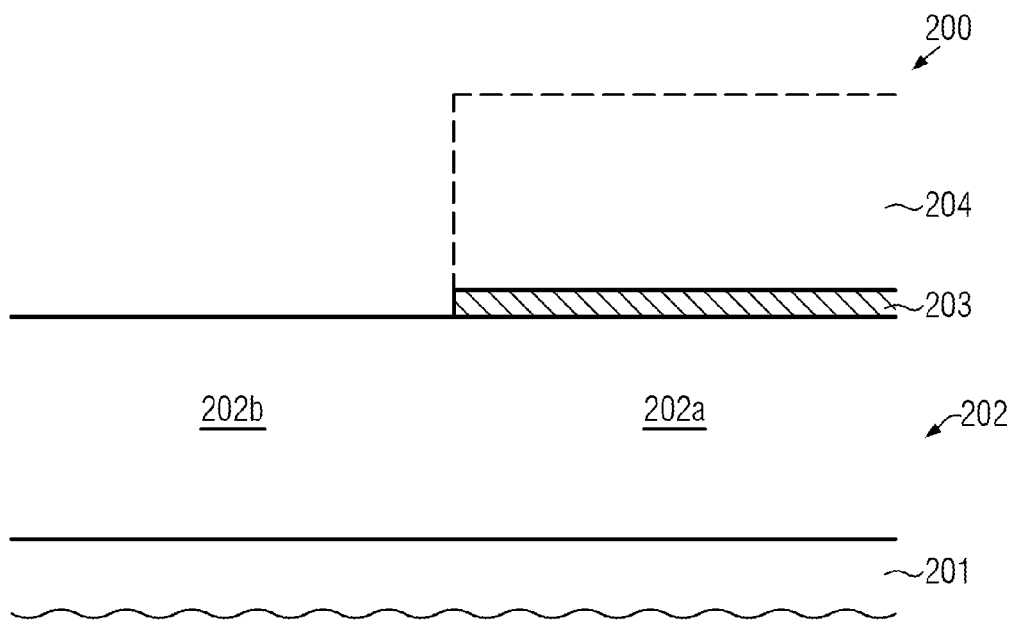
Figure 2C:
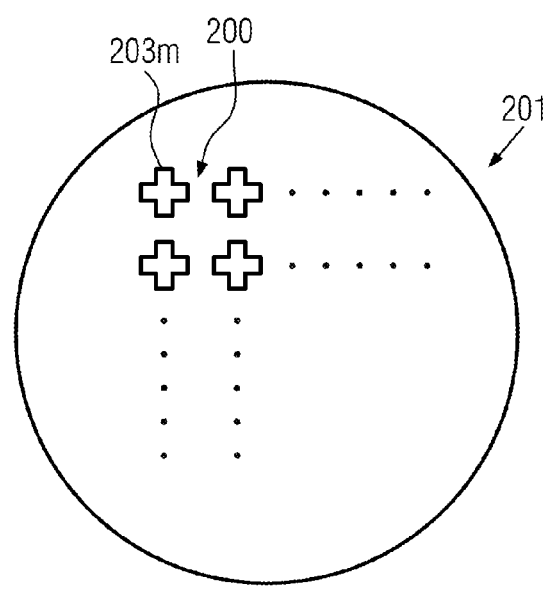
FIG. 2c schematically illustrates a top view of a substrate of the semiconductor device including appropriate alignment marks, according to illustrative embodiments.
Figure 2D:
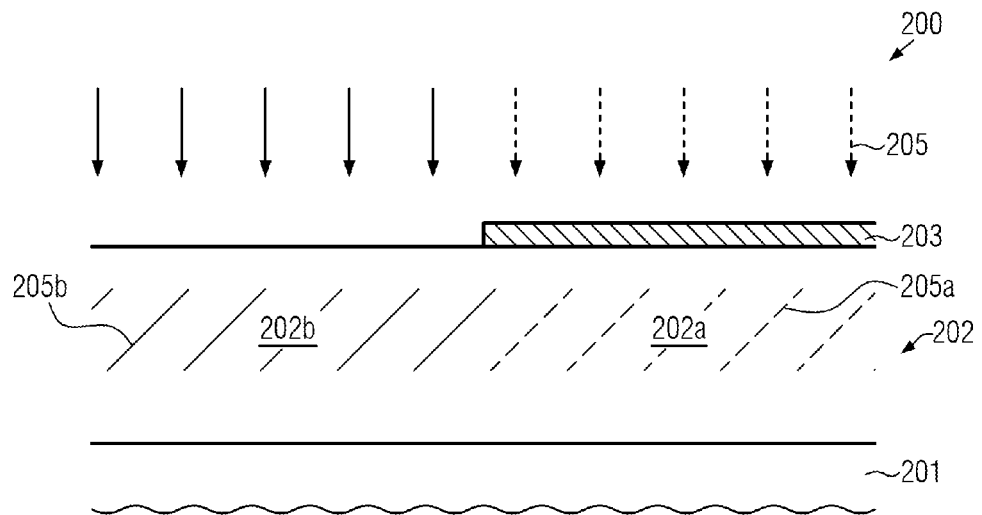
FIGS. 2d-2n schematically illustrate cross-sectional views of the semiconductor device along a width direction during various manufacturing stages in forming high-k metal gate electrode structures, according to illustrative embodiments.
Figure 2E:
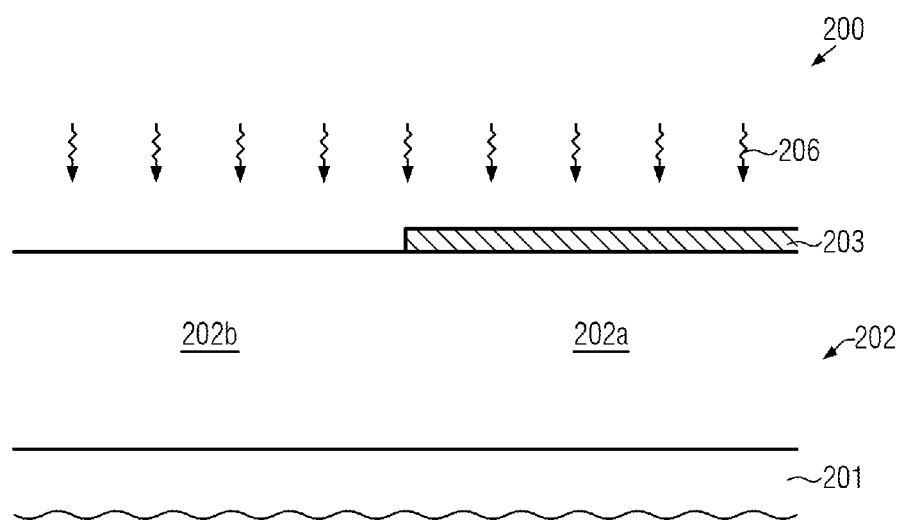
Figure 2F:
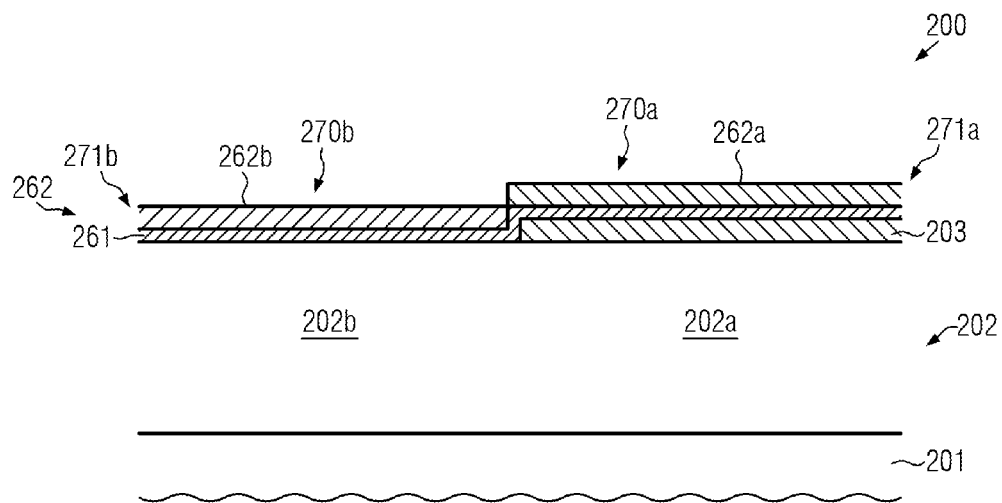
Figure 2G:
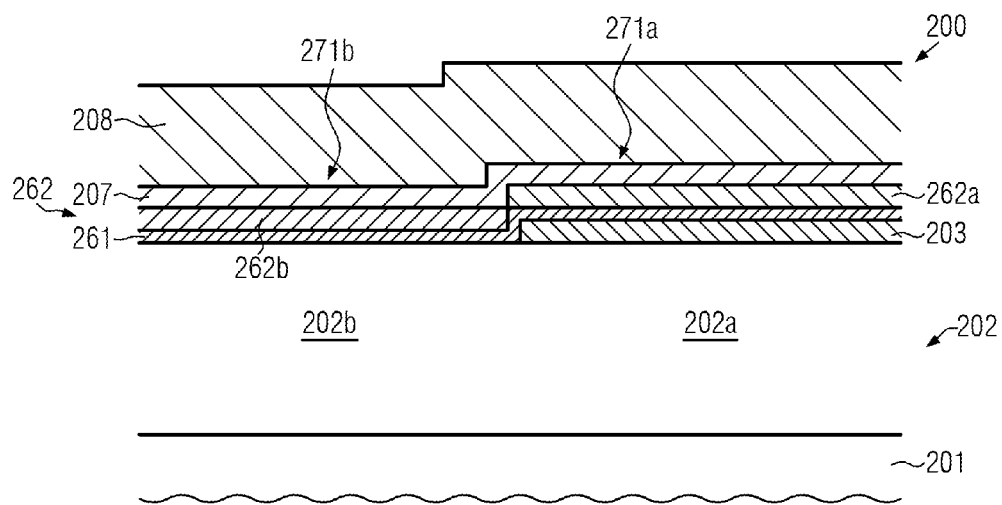
Figure 2H:
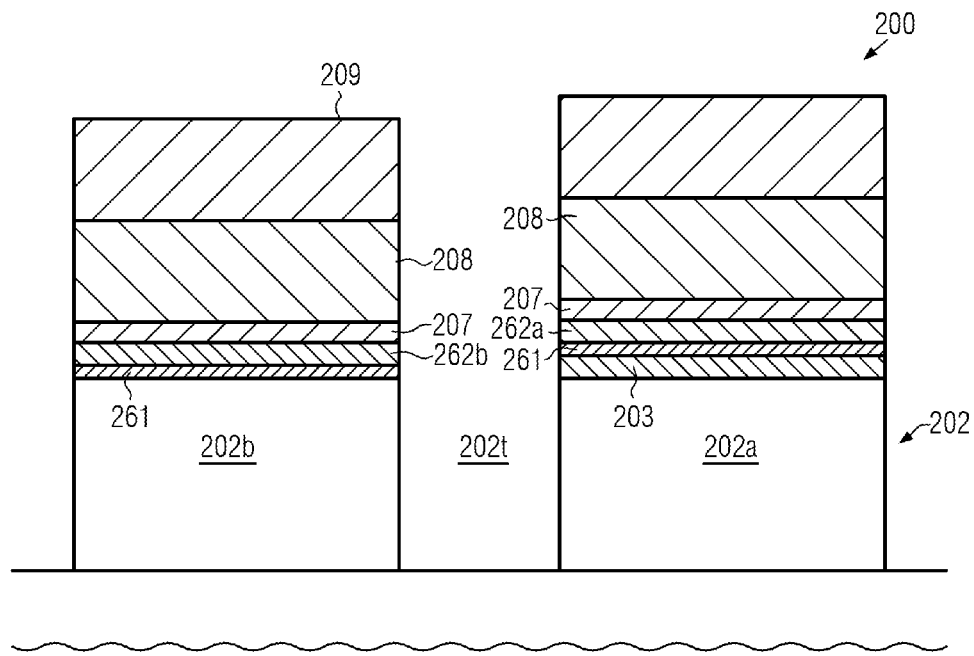
Figure 2I:
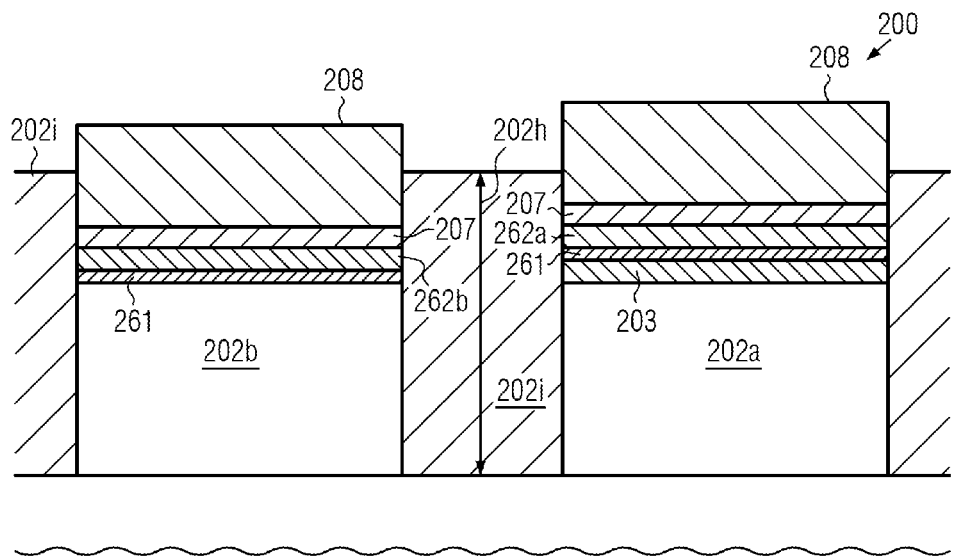
Figure 2J:
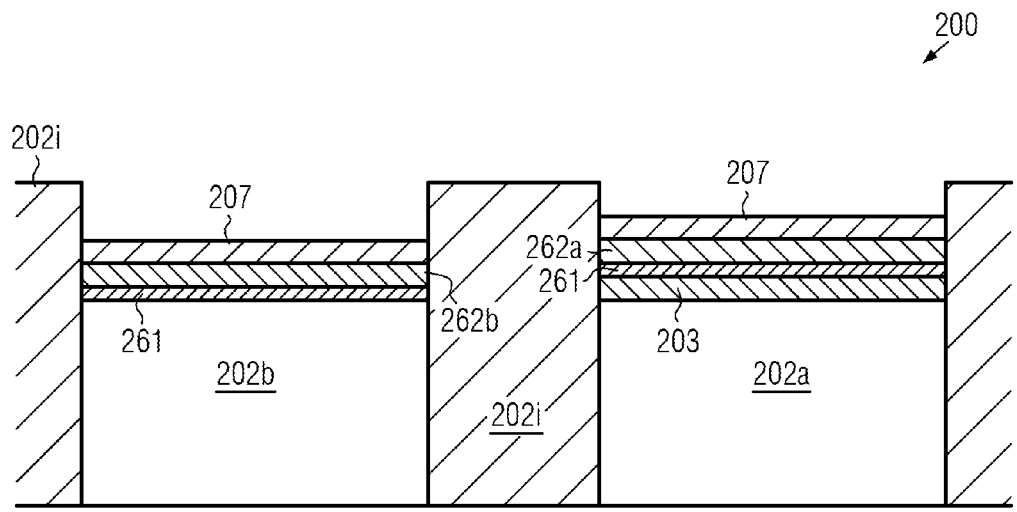
Figure 2K:
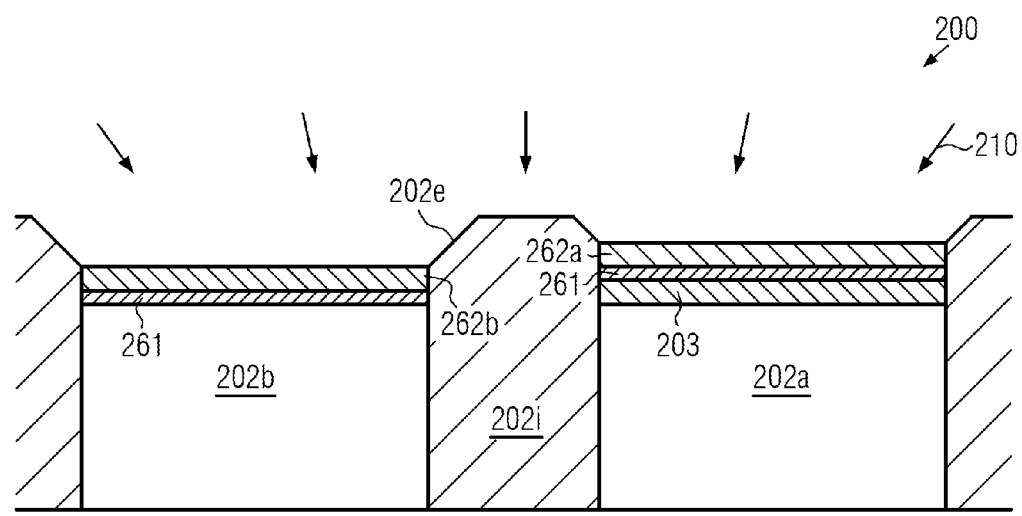
Figure 2L:
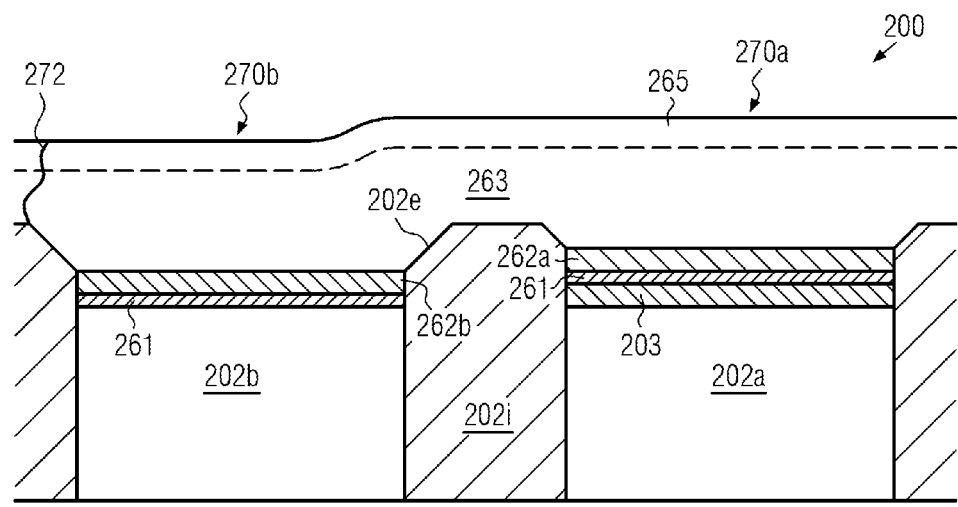
Figure 2M:
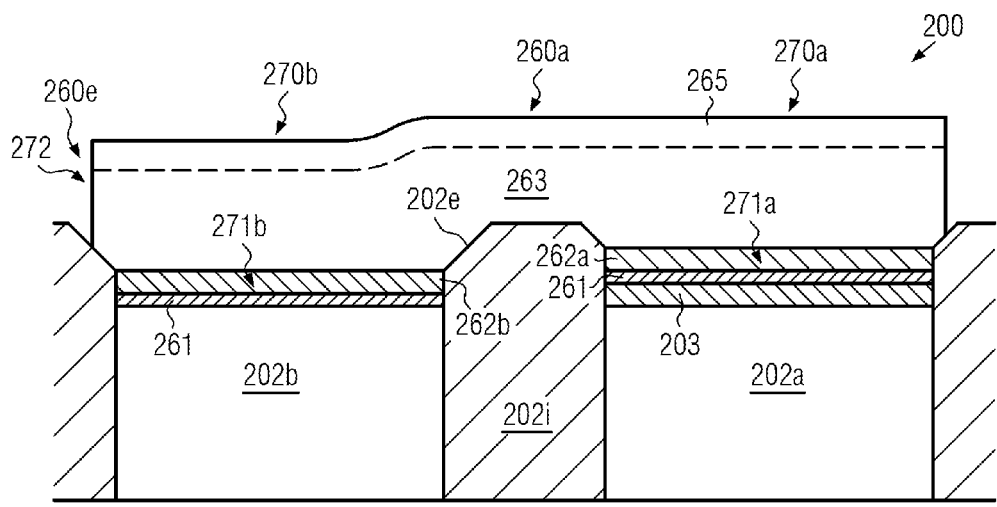
Figure 2N:
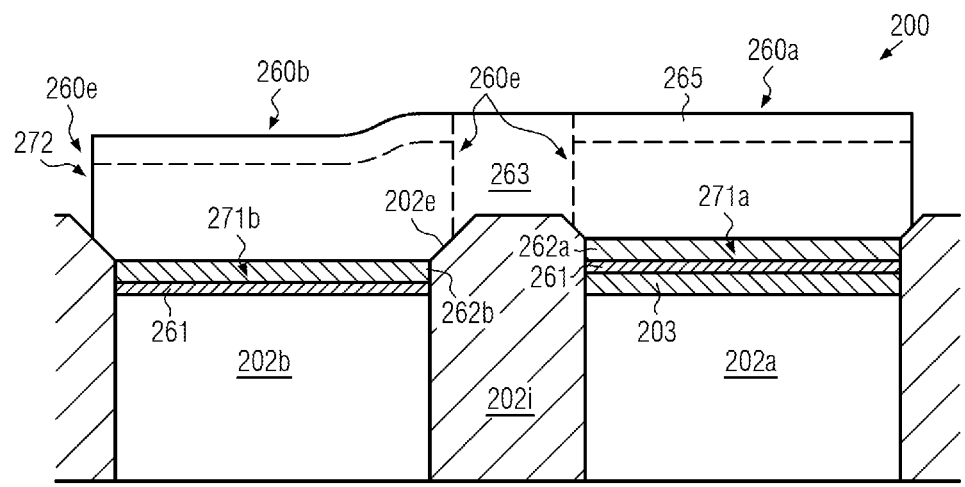
Figure 2O:
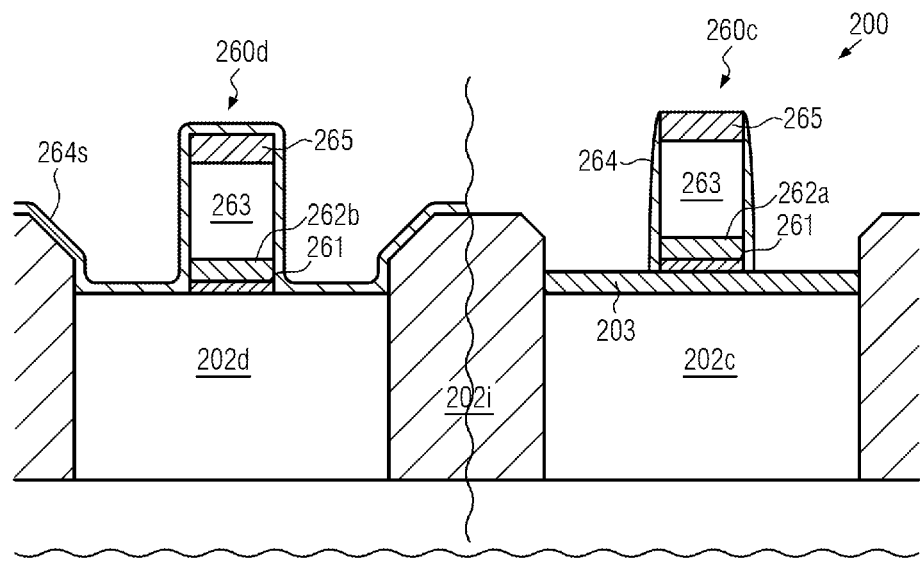
FIG. 2o schematically illustrates a cross-sectional view along a transistor length direction, according to illustrative embodiments.
Figure 2P:
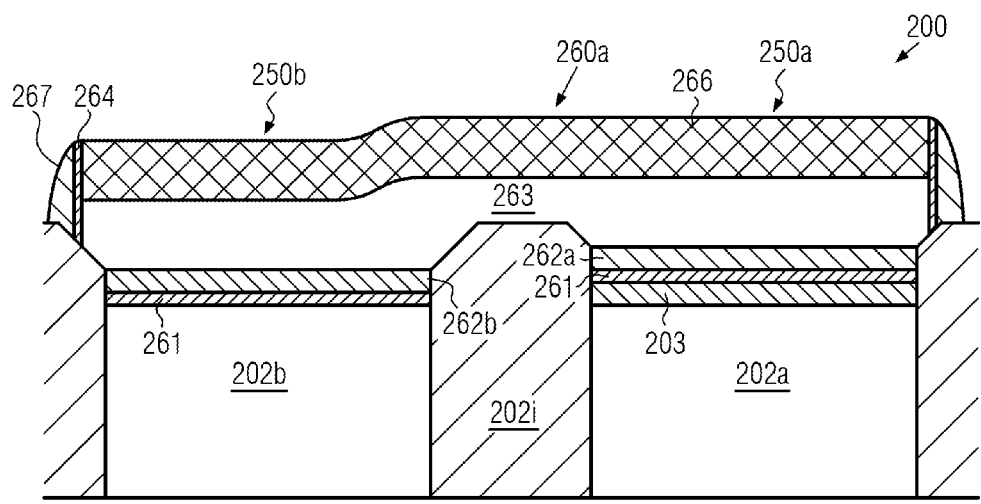
FIGS. 2p and 2q schematically illustrate cross-sectional views along a transistor width direction and a transistor length direction, respectively, of the semiconductor device in a very advanced manufacturing stage, according to illustrative embodiments.
Figure 2Q:
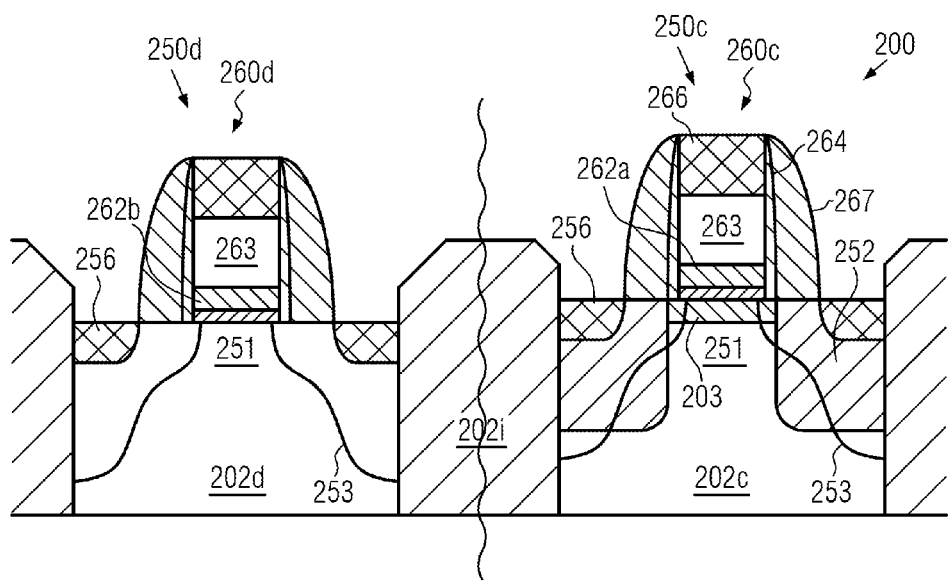

With reference to FIGS. 2a-2q, further illustrative embodiments will now be described in more detail, wherein reference may also be made to FIGS. 1a-1d, if appropriate.

FIG. 2a schematically illustrates a cross-sectional view of a semiconductor device 200 in an early manufacturing stage. The cross-sectional in FIG. 2a may be taken along a line as is indicated by Id in FIG. 1a, wherein it should be appreciated that any active regions in a semiconductor layer 202 may still have to be formed during the further processing. The semiconductor layer 202, which may be provided in the form of any appropriate semiconductor material, may be formed above a substrate 201, such as a semiconductor substrate and the like, wherein, if required, a buried insulating material (not shown) may be positioned below the semiconductor layer 202, if a silicon-on-insulator (SOI) architecture is to be used. Moreover, in this manufacturing stage, a semiconductor material 203 is formed on the semiconductor layer 202 so as to impart desired electronic characteristics to a part of the semiconductor layer 202. That is, the semiconductor material 203 is selected such that, in combination with the semiconductor layer 202, appropriate electronic characteristics, for instance with respect to the adaptation of the threshold voltage of transistors and the like, may be adjusted. For example, the layer 203 may be provided in the form of a semiconductor alloy, such as a silicon/germanium alloy and the like, having an appropriate material composition and layer thickness. For instance, a silicon material having a thickness of 5-12 nm and having a germanium content of 15-30 atomic percent may be used, wherein it should be appreciated that any other materials may be provided, depending on the requirements of transistor elements still to be formed. For example, different types of semiconductor material may be provided above different device areas of the semiconductor device 200.

The device 200 as shown in FIG. 2a may be formed on the basis of the following process strategy. Upon providing the substrate 201 comprising the semiconductor layer 202, appropriate surface treatments may be performed, such as cleaning processes and the like, in order to prepare the surface of the layer 202 for an epitaxial growth process in order to form the layer 203. To this end, any well-established deposition recipes may be applied. It should be noted that, contrary to the conventional selective epitaxial growth techniques, in some illustrative embodiments, the layer 203 may be provided without any growth masks, thereby enabling the usage of a wide variety of process parameters for the deposition process. In other cases, if required, corresponding hard mask materials (not shown) may be provided and may be selectively patterned to grow the material 203 in selective areas of the layer 202 on the basis of selective epitaxial growth techniques. If required, any further deposition cycles may be performed in different materials at different device areas.

FIG. 2b schematically illustrates the device 200 after the patterning of the semiconductor layer 203 so as to provide this layer above dedicated semiconductor regions of the layer 202. For example, the layer 203 formed on the first semiconductor region 202a thus represents a part of the semiconductor region 202a. On the other hand, the layer 203 may be removed from above a second semiconductor region 202b. It should be appreciated that the regions 202a, 202b may also be referred to as active regions, although a lateral delineation of these regions is not yet established.

The semiconductor layer 203 may be patterned on the basis of an etch mask 204, such as a resist mask, by applying any appropriate plasma assisted etch recipes and the like. For example, a plurality of etch recipes are available which have a significantly higher etch rate in a silicon/germanium material compared to a silicon material, thereby avoiding undue material erosion in the active region 202b. During a corresponding etch process based on the mask 204, also an appropriate alignment mark may be formed from the semiconductor layer 203, which may be used during the further processing upon performing any further lithography processes.

FIG. 2c schematically illustrates a top view of the substrate 201 including a plurality of the devices 200 in an early manufacturing stage, wherein alignment marks 203m are illustrated, which may be formed on the basis of the layer 203 as explained above with reference to FIG. 2b.

FIG. 2d schematically illustrates the device 200 in a further advanced manufacturing stage. As shown, the device 200 is subjected to a process sequence 205 in which appropriate dopant species 205b, 205a may be incorporated into the active regions 202b, 202a, respectively. To this end, the sequence 205 may comprise implantation processes in combination with appropriate masking regimes so as to form the active regions 202b, 202a with different electronic characteristics, for instance with a different basic conductivity type and the like. It should be appreciated that corresponding masking regimes may be applied on the basis of superior surface conditions due to a missing surface topography, except for the semiconductor layer 203, which, however, may have a very reduced thickness in the above-defined range. Moreover, if required, an additional screening layer (not shown) may be provided prior to performing the process sequence 205, for instance by forming a silicon dioxide layer and the like, which may be subsequently removed in a highly selective manner without causing significant material erosion in the active regions 202b, 202a.

FIG. 2e schematically illustrates the device 200 according to illustrative embodiments in which an anneal process 206 may be applied so as to thermally stabilize the previously incorporated dopant species, which may be accomplished on the basis of any well-established yield technique. It should be appreciated that the process 206 may also be used for re-crystallizing implantation-induced damage in the semiconductor layer 203, thereby reestablishing a high crystalline quality in the material 203.

FIG. 2f schematically illustrates the device 200 in a further advanced manufacturing stage. As shown, gate material layers of a first gate layer stack 270a and a second gate layer stack 270b may be formed on the active regions 202a, 202b as required for providing at least one type of sophisticated high-k metal gate electrode structure. That is, a gate dielectric layer 261, which may comprise a high-k dielectric material, for instance in the form of hafnium oxide and the like, may be applied in combination with a metal-containing electrode material 262, which, in the embodiment shown, may be provided with different material characteristics above the active region 202b and the active region 202a, thereby forming respective first parts 271a, 271b of the first and second gate layer stacks 270a, 270b. That is, a metal-containing electrode material 262b may be formed above the active region 202b and may be appropriately selected so as to provide the desired electronic characteristics for a transistor element to be formed in and above the active region 202b. Similarly, a metal-containing electrode material 262a may be formed above the active region 202a and may provide appropriate electronic characteristics of a transistor to be formed in and above the active region 202a. It should be appreciated, however, that, in other illustrative embodiments, the layer 262 may have substantially the same characteristics above both active regions 202a, 202b and may impart appropriate electronic characteristics to only one of these regions, while the material in question may then be removed in a very advanced manufacturing stage from one of the regions 202a, 202b, for which other electronic characteristics are required.

The device 200 as shown in FIG. 2f may be formed on the basis of process strategies including the formation of the material 261, which may include the deposition or growth of a conventional dielectric material followed by the deposition of a high-k dielectric material, if superior interface characteristics are required on the basis of a conventional dielectric material. Thereafter, one or more metal-containing electrode materials may be deposited and may be patterned so as to form an appropriate electrode material above one of the active regions 202a, 202b, followed by the removal and deposition and patterning of a further electrode material, which may then be provided selectively above the other one of the active regions 202a, 202b. In other cases, appropriate material layers including work function adjusting metal species, such as aluminum, lanthanum and the like, may be selectively provided and may be incorporated into the lower lying dielectric material 261, followed by the deposition of a common electrode material, for instance in the form of the layer 262. It should be appreciated that, in this case, the layer 261 may have different characteristics above the different active regions 202a, 202b. Also in this case, the first parts 271a, 271b of the gate layer stacks 270a, 270b may differ from each other in order to obtain the required electronic characteristics of different types of transistors still to be formed.

It should be noted that also the process sequence including deposition, patterning processes, anneal processes and the like may be performed on the basis of the superior surface topography due to the absence of any isolation regions, as is also discussed above.

FIG. 2g schematically illustrates the semiconductor device 200 in a further advanced manufacturing stage in which one or more hard mask materials may be provided in order to enable the patterning of the semiconductor layer 202 and the first parts 271a, 271b of the gate layer stacks. For example, a silicon dioxide layer 207 followed by a silicon nitride material 208 may be provided with an appropriate thickness by using well-established deposition techniques. In this manner, a high degree of compatibility with conventional shallow trench isolation techniques may be achieved. It should be appreciated, however, that any other hard mask materials may be used in this manufacturing stage if compatible with the further processing of the device 200.

FIG. 2h schematically illustrates the device 200 in a further advanced manufacturing stage. As shown, an etch mask 209 may be provided above the one or more hard mask materials 207, 208, for instance in the form of a resist material and the like, having an appropriate mask opening so as to define the lateral position, size and shape of a trench 202t formed in the semiconductor layer 202 and in the material layers 261, 262b, 262a, 207 and 208. Consequently, the trench 202t may thus laterally delineate the active regions 202a, 202b in accordance with the overall layout requirements, for instance as discussed above with reference to FIG. 1a.

The device 200 as shown in FIG. 2h may be formed on the basis of well-established lithography techniques for patterning the etch mask 209, followed by an etch process so as to etch through the hard mask material 208, while the layer 207 may be used as an etch stop material. To this end, well-established plasma-assisted etch recipes may be applied. Thereafter, the layer 207 may be opened by applying any appropriate plasma-assisted etch recipe or wet chemical etch process followed by an etch step etching through the materials 262a, 262b and 261 and finally etching into the semiconductor material of the layer 202 so that the trench 202t may extend to a desired depth, for instance to a buried insulating layer (not shown), when an SOI architecture is used. It should be appreciated that the patterning of the layers 261, 262a, 262b may be accomplished by using etch recipes which are typically also used in conventional gate patterning processes when forming sophisticated high-k metal gate electrode structures in an early manufacturing stage, as, for instance, discussed above with reference to the semiconductor device 100.

FIG. 2i schematically illustrates the device 200 with an isolation region 202i provided in the previously formed trench 202t (FIG. 2h). To this end, the etch mask 209 (FIG. 2h) may be removed and any appropriate additional process steps may be applied, followed by the deposition of one or more appropriate dielectric materials. For example, a silicon dioxide material may be deposited on the basis of well-established deposition recipes, possibly in combination with anneal processes, while, in other cases, if a pronounced corner rounding of the active regions 202a, 202b may be avoided, appropriate process conditions for depositing a first portion of the silicon dioxide material may be selected. In other cases, if required, a silicon nitride material may be used, possibly in combination with a silicon dioxide material. Thereafter, any excess material may be removed, for instance, by chemical mechanical polishing (CMP), wherein the layer 208 may be used as a stop material. Next, a desired height 202h of the isolation region 202i may be adjusted by removing a portion of the dielectric material, for instance on the basis of any appropriate removal process, such as wet chemical etch processes and the like. It should be appreciated that the height 202h may be selected such that an acceptable compromise with respect to the resulting surface topography of the regions 202a, 202b and 202i is obtained during the further processing. Since typically the corresponding degree of material erosion during the further processing may be well known, an appropriate initial height 202h may be readily selected.

FIG. 2j schematically illustrates the device 200 after the removal of the hard mask material 208 (FIG. 2i). The removal of this material may be accomplished by using highly selective etch recipes, such as hot phosphoric acid for silicon nitride material, wherein the second hard mask material 207 may act as an efficient etch stop material. Similarly, due to the high selectivity of the etch recipe, a significant material erosion in the isolation region 202i may be avoided in this process step.

FIG. 2k schematically illustrates the device 200 during a further etch process 210, which is applied in order to remove the hard mask material 207 (FIG. 2j). The process 210 may be performed, for instance, on the basis of diluted hydrofluoric acid (HF) or on the basis of plasma-assisted etch recipes, or a combination thereof, wherein process parameters may be established in advance so that a highly controllable material removal in the isolation region 202i is achieved. For example, a certain degree of material erosion, in particular at edge regions 202e of the isolation region 202i, may be induced, however, in a highly controllable manner due to the superior controllability of the etch process 210. Hence, during the process 210 or any subsequent process step, the materials 262b, 262a may be exposed, which thus have lateral dimensions that correspond to the lateral dimensions of the corresponding active regions 202a, 202b and which, therefore, do not overlap with the isolation region 202i.

FIG. 2l schematically illustrates the device 200 in a further advanced manufacturing stage. As shown, one or more material layers of the first and second gate layer stacks 270a, 270b may be provided, for instance in the form of an electrode material 263, such as silicon, silicon/germanium and the like, followed by one or more cap layers 265, such as silicon nitride, silicon dioxide and the like. Hence, the layers 263, 265 form a second part 272 of the gate layer stacks 270a, 270b. The layers 263, 265 may be formed on the basis of well-established deposition techniques, such as low pressure chemical vapor deposition (CVD), plasma assisted CVD and the like, wherein, if required, material characteristics, in particular of the layer 263, may be adjusted, for instance, by in situ doping and the like. It should be appreciated that the resulting gate layer stack formed above any portion of the isolation region 202i is comprised of the layers 263, 265, i.e., of the second part 272, while the previously provided materials 261, 262a, 262b are laterally restricted to active regions such as the regions 202a, 202b.

FIG. 2m schematically illustrates the device 200 in a further advanced manufacturing stage. As illustrated, a gate electrode structure 260a may be formed above the active regions 202a, 202b and may thus represent a "common" gate electrode structure or different transistors to be formed in and above the active regions 202a, 202b. For example, the gate electrode structure 260a may be provided in a manner as is, for instance, previously discussed with reference to the device 100 when referring to the layout as shown in FIG. 1a. Consequently, the gate electrode structure 260a comprises the first part 271b and the second part 272 above the active region 202b and comprises the first part 271a and the second part 272 above the active region 202a, while above the isolation region 202i only the second part 272 is provided. Similarly, corresponding end portions 260e are formed above the respective areas of the isolation region 202i and are exclusively comprised of the second part 272 of the gate layer stacks 270a, 270b.

The gate electrode structure 260a may be formed on the basis of any appropriate patterning strategy. For example, as discussed above, a double exposure/double etch strategy may be applied in which the hard mask material 265 or the entire gate layer stack may be patterned so as to define the gate length, while a separate lithography and patterning process may be applied in order to obtain the required gate width, i.e., in FIG. 2m the horizontal extension of the gate electrode structure 260a. In other cases, the patterning of the gate width may be applied prior to defining the gate length, if a corresponding strategy is considered appropriate in view of the overall process strategy. In still other illustrative embodiments, the gate width may be defined in a later manufacturing stage, i.e., after patterning the gate electrode structure 260a, so as to have a desired gate length, thereby providing the gate electrode structure 260a in the form of a gate line, wherein the further processing may be continued, for instance, by forming an encapsulation liner and the like, wherein the final patterning of the gate width may then be applied at any appropriate stage, for instance in the presence of the protective liner material, if considered appropriate in view of overall process efficiency. At any rate, the patterning of the gate electrode structure 260a so as to define the gate width may be accomplished on the basis of relaxed process conditions since the corresponding patterning sequence does not involve the patterning of metal-containing electrode materials, which are not provided above the isolation region 202i. For this reason, it is also acceptable to omit a protective liner at the end portions 260e, which thus allows for superior process flexibility in appropriately positioning the gate width patterning process within the overall process flow.

It should be appreciated, however, that any other sophisticated gate patterning regime may be applied and is thus compatible with the early provision of the first part 271a, 271b of the gate layer stacks 270a, 270b.

FIG. 2n schematically illustrates the device 200 in a situation in which individual gate electrode structures are to be provided above the active regions 202a, 202b. For example, the gate electrode structure 260a may be provided above the region 202a, while a gate electrode structure 260b may be formed above the active region 202b. To this end, during the gate width patterning process, the gate layer materials may also be etched above the isolation region 202i extending between the active regions 202a, 202b, thereby forming corresponding end portions 260e above this part of the isolation region 202i. Consequently, also in this case, the end portions terminate above the dielectric material of the isolation region 202i without exposing any sensitive gate materials.

FIG. 2o schematically illustrates a cross-sectional view of the device 200 along a length direction, i.e., along a section indicated as IIo in FIG. 1a. As shown, an active region 202c, which may correspond in its configuration to the previously described active region 202a (FIG. 2n) comprises the semiconductor material 203 as a part of the active region, on which may be formed a gate electrode structure 260c having substantially the same configuration as the gate electrode structure 260a described above with reference to the previous FIGS. 2a-2n. Similarly, an active region 202d, which may have a similar configuration as the active region 202b of FIG. 2n, may be provided and may comprise a gate electrode structure 260d having a similar configuration as, for instance, the gate electrode structure 260b formed above the active region 202b in FIG. 2n. Consequently, the gate electrode structures 260c, 260d may be formed on the basis of the process strategy as described before.

Moreover, in this manufacturing stage, a liner or spacer layer 264s may be formed above the active region 204d and the gate electrode structure 260d as well as above corresponding portions of the isolation region 202i. On the other hand, the spacer layer 264s is already patterned into a protective liner or spacer 264 so as to cover the sensitive materials 261, 262a in the gate electrode structure 260c. To this end, the spacer layer 264s may be deposited on the basis of any appropriate deposition technique, as is also discussed above. After patterning the gate electrode structures 260c, 260d, at least in the length direction as shown in FIG. 2o, while a patterning in the width direction (FIG. 2m) may be performed in a later manufacturing stage, as discussed above. Irrespective of whether the gate electrode structures 260c, 260d are already patterned in both lateral directions, a reliable confinement of any sensitive materials is accomplished since no sensitive materials are formed above any part of the isolation region 202i. Consequently, critical surface areas of the materials 261, 262a, 262b are provided above the active regions only and may thus be reliably covered by the spacer layer 264s or the spacer 264, irrespective of any topography formed by the isolation region 202i in the vicinity of corresponding active regions.

It should be appreciated that the patterning of the spacer layer 264s may be accomplished by providing an appropriate etch mask, such as a resist mask, and employing well-established etch recipes. In some illustrative embodiments, the etch process may be continued so as to etch into the active region 202c in order to form cavities therein, which may be subsequently filled with an appropriate strain-inducing semiconductor material. Due to the reliable coverage of the sensitive materials 261, 262a, 262b, a reduced width of the spacer 264 may be used, thereby enhancing overall efficiency of any such embedded strain-inducing semiconductor material. At a later stage, the spacer layer 264s may be patterned into a corresponding spacer element by applying a further masked etch process, wherein, as discussed earlier with respect to FIG. 1d, any double exposure to the reactive etch atmosphere in a transition area of a common gate electrode does not negatively affect overall gate integrity, which may contribute to significant yield losses in conventional strategies, as discussed above.

FIG. 2p schematically illustrates the device 200 in a further advanced manufacturing stage wherein, again, the sectional view of, for instance, FIGS. 2m and 2n is illustrated. As shown, a transistor 250a may be formed in and above the active region 202a, which may comprise the semiconductor material 203, while a transistor 250b is formed in and above the active region 202b. As discussed above, the transistors 250a, 250b may be of inverse conductivity type, while, in other cases, at least these transistors may have significantly different transistor characteristics. Furthermore, in this manufacturing stage, the gate electrode structure may comprise a highly conductive metal silicide material 266, which may be formed in and on a portion of the semiconductor electrode material 263. Furthermore, an additional spacer structure 267 may be provided, as may be required for forming appropriate drain and source regions (not shown in FIG. 2p) in the active regions 202a, 202b.

FIG. 2q schematically illustrates a cross-sectional view of the device 200 along the length direction, wherein the manufacturing stage shown in FIG. 2q corresponds to the manufacturing stage as shown in FIG. 2p. Hence, in this sectional view, a transistor 250c, which may have a similar configuration as the transistor 250a in FIG. 2p, and a transistor 250d, which may have a similar configuration as the transistor 250b in FIG. 2p, may be formed in and above the respective active regions 202c, 202d. Similarly, the gate electrode structures 260c, 260d may have basically the same configuration as the gate electrode structure 260a, i.e., the portion thereof formed above the active regions 202a, 202b, respectively (FIG. 2p). Moreover, the transistors 250c, 250d may comprise drain and source regions 253 that laterally enclose a channel region 251. Furthermore, a metal silicide 256 may be provided in the drain and source regions 253. In the embodiment shown, a strain-inducing semiconductor material 252, for instance in the form of a silicon/germanium material and the like, may be provided in the active region 202c in order to induce a desired type of strain in the corresponding channel region 251 in order to enhance overall performance of the transistor 250c, as is also discussed above.

The device 200 as shown in FIGS. 2p and 2q may be formed on the basis of the following process strategy. After patterning the gate electrode structures 260a, 260c, 260d, the embedded semiconductor material 252 may be formed, for instance, by providing cavities and filling the same with an appropriate semiconductor alloy, as discussed above, while, in other cases, a corresponding strain-inducing mechanism may be omitted if sufficient performance is obtained without such a strain-inducing mechanism. In other cases, a strain-inducing material may also be incorporated into the active region 202d if considered appropriate. Prior to or after incorporating the material 252, a portion of the drain and source regions 253 may be formed, for instance by ion implantation, followed by the formation of the spacer structure 267, which may be accomplished by using well-established deposition and etch regimes. Next, the drain and source regions 253 may be completed, for instance by performing further implantation processes and finally activating the dopants and re-crystallizing implantation-induced damage by applying any appropriate anneal regime. At any appropriate stage of the manufacturing flow, the cap layer 264 (FIG. 2m) may be removed so as to enable the formation of the metal silicide 266 in the gate electrode structures 260a, 260d, 260c. To this end, any appropriate silicidation regime may be applied wherein also the metal silicide 256 in the drain and source regions 253 may be formed.

As a result, the transistors 250a, 250c, 250d may be formed so as to have a well-defined gate width since the gate dielectric material 261 as well as the electrode materials 262a, 262b are laterally restricted to the corresponding active regions, as is for instance shown in FIG. 2p, so that the formation of a "three-dimensional" gate structure is avoided. Furthermore, the probability of inducing gate failures due to non-sufficient confinement of sensitive gate materials may be significantly reduced by avoiding the presence of any such material on isolation regions, which may be accomplished by forming the isolation regions after providing the sensitive gate materials. Consequently, metal-containing gate material is no longer present at gate portions which are formed above an isolation region. Hence, superior process robustness, reduced yield loss and enhanced flexibility in designing the overall process flow is accomplished. Furthermore, any complex process strategies, which are frequently applied in conventional processes in order to attempt to reduce the resulting surface topography upon forming a threshold voltage adjusting semiconductor material, such as additional mask steps and the like, may be omitted, thereby also contributing to superior process efficiency.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate dielectric material and a first electrode material on a semiconductor layer of a semiconductor device;
    forming an isolation region in said semiconductor layer so as to laterally delineate active regions in said semiconductor layer, said isolation region extending through said gate dielectric material and said first electrode material;
    forming a second electrode material above said active regions and said isolation region; and
    forming gate electrode structures at least from said second electrode material, said gate dielectric material and said first electrode material, wherein a first end portion of at least one of said gate electrode structures is positioned above a first portion of said isolation region and a second end portion of said at least one of said gate electrode structures is positioned above a second portion of said isolation region, said first portion of said isolation structure being laterally separated from said second portion of said isolation structure by at least one of said active regions.

2. The method of claim 1, wherein forming said gate dielectric material comprises forming a high-k dielectric material.

3. The method of claim 2, wherein forming said first electrode material comprises forming at least one metal-containing layer above said gate dielectric material.

4. The method of claim 1, further comprising forming a semiconductor alloy selectively on a first portion of said semiconductor layer prior to forming said isolation region.

5. The method of claim 4, wherein forming said isolation region comprises forming said isolation region so as to laterally delineate a first active region comprising said semiconductor alloy and to laterally delineate a second active region lacking said semiconductor alloy.

6. The method of claim 1, further comprising introducing well dopant species into said semiconductor layer prior to forming said isolation region.

7. The method of claim 1, wherein forming said isolation region comprises forming a dielectric layer stack, patterning said dielectric layer stack so as to form a hard mask that defines a lateral size and position of said isolation region.

8. The method of claim 7, wherein forming said isolation region further comprises forming a trench in said gate dielectric material, said first electrode material and in said semiconductor layer and filling said trench with an insulating material.

9. The method of claim 8, wherein forming said isolation region further comprises removing a first dielectric layer of said layer stack selectively to a second dielectric layer of said layer stack and removing said second dielectric layer so as to adjust a material loss in said isolation region.

10. The method of claim 1, further comprising forming a strain-inducing semiconductor material in at least some of said active regions after forming said gate electrode structures.

11. The method of claim 1, further comprising forming an encapsulation spacer on sidewalls of said gate electrode structures prior to forming drain and source regions in said active regions.

12. A method, comprising:
  forming a first part of a first gate layer stack above a first portion of a semiconductor layer of a semiconductor device;
  forming a first part of a second gate layer stack on a second portion of said semiconductor layer;
  forming an isolation region in said semiconductor layer so as to laterally separate said first parts of said first and second gate layer stacks;
  forming a second part of said first and second gate layer stacks above said first parts and above said isolation region; and
  forming a first gate electrode structure of a first transistor from said first and second parts of said first gate layer stack, wherein a first end portion of said first gate electrode structure is positioned above a first portion of said isolation region and a second end portion of said first gate electrode structure is positioned above a second portion of said isolation region; and;
  forming a second gate electrode structure of a second transistor from said first and second parts of said second gate layer stack, said first and second transistors differing in conductivity type, wherein a first end portion of said second gate electrode structure is positioned above a third portion of said isolation region and a second end portion of said second gate electrode structure is positioned above a fourth portion of said isolation region.

13. The method of claim 12, further comprising forming a semiconductor alloy on said first portion prior to forming said first parts of said first and second gate layer stacks.

14. The method of claim 12, further comprising introducing a first well dopant species into said first portion and a second well dopant species into said second portion prior to forming said first parts of said first and second gate layer stacks.

15. The method of claim 14, further comprising performing an anneal process prior to forming said first parts of said first and second gate layer stacks.

16. The method of claim 12, wherein forming said first parts of said first and second gate layer stacks comprises providing at least one metal-containing material so as to adjust a work function of at least one of said first and second gate electrode structures.

17. The method of claim 12, further comprising forming an encapsulation spacer on sidewalls of said first and second gate electrode structures prior to applying a wet chemical cleaning process to said first and second gate electrode structures.

18. A semiconductor device comprising:
  an active region laterally delineated by an isolation region; and
  a gate electrode structure formed on said active region and having first end portion positioned above a first portion said isolation region and a second end portion positioned above a second portion of said isolation region, said gate electrode structure comprising a high-k dielectric material formed on said active region and extending to said isolation region without overlapping said isolation region.

19. The semiconductor device of claim 18, wherein said gate electrode structure further comprises a metal-containing electrode material formed above said high-k dielectric material and extending to said isolation region without overlapping said isolation region.

20. The semiconductor device of claim 18, wherein said active region comprises a threshold voltage adjusting semiconductor alloy formed below said high-k dielectric material.

21. The semiconductor device of claim 18, wherein said first portion of said isolation region is laterally separated from said second portion of said isolation region by said active region.

22. The method of claim 12, wherein said first portion of said isolation region is laterally separated from said second portion of said isolation region by at least a first active region of said first transistor.

23. The method of claim 12, wherein said third portion of said isolation region is laterally separated from said fourth portion of said isolation region by at least a second active region of said second transistor.

* * * * *